United States Patent [19]

Kita et al.

[11] Patent Number: 4,601,974

[45] Date of Patent: Jul. 22, 1986

[54] DESENSITIZING GUM FOR LITHOGRAPHIC PRINTING

[75] Inventors: Nobuyuki Kita; Hiroshi Matsumoto; Masanori Imai, all of Shizuoka, Japan

[73] Assignee: Fuji Photo Film Co., Ltd., Kanagawa, Japan

[21] Appl. No.: 759,940

[22] Filed: Jul. 29, 1985

Related U.S. Application Data

[63] Continuation of Ser. No. 531,796, Sep. 13, 1983, abandoned.

[30] Foreign Application Priority Data

Sep. 13, 1982 [JP] Japan ................................ 57-159284

[51] Int. Cl.$^{4}$ ............................ G03F 7/00; B41N 3/00

[52] U.S. Cl. .................................... 430/309; 430/302; 101/451; 101/465; 101/463.1; 106/2

[58] Field of Search ........................ 430/302, 309, 331; 101/451, 463.1, 465, 466; 106/2

[56] References Cited

U.S. PATENT DOCUMENTS

| | | | |
|---|---|---|---|
| 3,019,106 | 1/1962 | Adams | 430/331 X |
| 3,467,537 | 9/1969 | Pickard | 427/384 |
| 3,619,217 | 11/1971 | West | 430/331 |
| 4,213,887 | 7/1980 | Walls et al. | 260/29.6 E |
| 4,370,404 | 1/1983 | Tachikawa et al. | 430/302 |
| 4,475,460 | 10/1984 | Matsumoto | 101/465 |

OTHER PUBLICATIONS

Davidson et al, *Water-Soluble Resins,* Van Nostrand Reinhold (1962), New York.

Strauss, *The Lithographer's Manual,* Waltwin Publishing Co. (1958), New York.

*Primary Examiner*—John E. Kittle

*Assistant Examiner*—José G. Dees

*Attorney, Agent, or Firm*—Sughrue, Mion, Zinn Macpeak & Seas

[57] ABSTRACT

A desensitizing gum for a lithographic printing plate and a gumming up process thereof are disclosed. The gum is comprised of water having dispersed therein 5 to 35 wt %, based on the total weight of the gum, of a film-forming, water-soluble compound selected from the group consisting of enzyme-decomposed dextrine and enzyme-decomposed etherified dextrine. The desensitizing gum exerts a desensitizing action on non-image areas of a lithographic printing plate and does not cause image blinding of image areas even when the plate is stored for a long period of time.

9 Claims, No Drawings

DESENSITIZING GUM FOR LITHOGRAPHIC PRINTING

This is ia continuation of application Ser. No. 531,796 filed Sept. 13, 1983, abandoned.

FIELD OF THE INVENTION

The present invention relates to a desensitizing gum for lithographic printing plates.

BACKGROUND OF THE INVENTION

In making lithographic printing plates, a step of coating a desensitizing gum, called a gumming-up step, is provided as a final step for protecting non-image areas (areas which retain water to repel a printing ink).

The desensitizing gum is applied to non-image areas to protect the hydrophilicity of the non-image areas as well as to protect the areas from being stained or flawed by adhesion of fingerprints, fats and oils, dusts, etc. upon correction of image areas such as retouching or erasure, during storage before printing and after plate making or storage before reuse, or upon handling to mount the printing plate on a press and, in addition, to prevent oxidative stains. Known gum compositions for lithographic printing plates which include compositions comprising an aqueous solution of gum arabic, cellulose gum or a water-soluble high molecular substances containing carboxy groups in the molecule and optionally containing a pH-adjusting agent, an antiseptic, etc. have been popularly used. However, these conventionally known compositions have the following problems. That is, in the final step of finishing a printing plate, a gum solution is applied to the printing plate and spread all over the plate surface using a sponge or a cotton pad, followed by polishing the plate surface with a cotton pad or a cloth wiper until it becomes dry, upon which the water-soluble high molecular substance is thickly coated in part on image areas (areas which receive an ink). The thickly coated image areas have such a poor ink receptivity in printing that many copies must be printed before the image fully accepts ink. This phenomenon is generally called image blinding (so-called blinding). Where the above-described phenomenon takes place, the plate generally must be subjected to a washing step with water or weakly acidic solution to thereby remove the hydrophilic colloid adsorbed on the image areas for reproducing image areas. This washing step consumes much time, and hence there has been developed a removing solution for desensitizing gum as described in U.S. Pat. No. 4,024,085.

The coating of image areas with fats and oils before the gumming-up step has been carried out for the purpose of protecting ink-receptive properties of the image areas. However, this makes the plate-making step complicated and deteriorates workability and, in addition, it is not preferable due to the pollution and health hazard problems. Accordingly, attempts have been made at using a water-soluble organic high molecular compound which does not causing image blinding as a desensitizing gum. For example, U.S. Pat. No. 4,095,525 and British Pat. No. 2,010,298, West German Pat. No. 2,504,594, and Soviet Pat. No. 623,755 disclose dextrin, pullulan and its derivatives, carboxy-containing polyacrylamide derivatives, methyl acrylate(or methacrylate)-grafted polyacrylamide copolymer, etc. However, these compounds are not desirable because they exert only a poor desensitizing action on non-image areas.

SUMMARY OF THE INVENTION

It is, therefore, an object of the present invention to provide a desensitizing gum which exerts a desensitizing action on non-image areas of a lithographic printing print and which does not cause image blinding of image areas even when the plate is stored for a long period of time.

Another object of the present invention is to provide a desensitizing gum which can be easily applied to a printing plate using a sponge, a cotton pad or an automatic gum coater, which can be easily removed from the lithographic printing plate by washing with water or bringing the plate into contact with dampening rollers on a lithographic press, and which makes it possible to maintain the hydrophilicity in non-image areas.

As a result of intensive investigations for attaining the above-described objects, the inventors have achieved the present invention.

That is, the inventors have found that the above-described objects can be attained by using as a desensitizing gum at least one dextrin selected from the group consisting of film-forming, water-soluble, enzyme-decomposed dextrin and enzyme-decomposed etherified dextrin.

DETAILED DESCRIPTION OF THE INVENTION

The enzyme-decomposed dextrin is prepared by decomposing startch (potato, sweet potato, wheat, corn starch, tapioca or rice) using an enzyme such as α-amylase, β-amylase or saccharogenic amylase into dextrin. The enzyme-decomposed etherified dextrin is a dextrin prepared by decomposing hydroxyethyl starch, hydroxypropyl starch, ethyl starch or the like using the above-described enzyme. The degree of decomposition of the dextrin or the etherified dextrin with enzyme is determined by an amount of reducing sugar contained therein. The decomposition is conducted to such a degree that a resulting decomposed dextrin or etherified dextrin contains preferably 10 to 40 wt % of reducing sugar. More preferable enzyme-decomposed dextrin or etherified dextrin has 5 to 30 cps when it is dissolved in water to form 10 wt % aqueous solution at 25° C.

The content of the enzyme-decomposed dextrin or the enzyme-decomposed etherified dextrin in the desensitizing gum of the present invention ranges from about 5 to about 35 wt %, preferably from 10 to 25 wt %. The enzyme-decomposed dextrin or enzyme-decomposed etherified dextrin is used as a uniform aqueous solution prepared by dissolving the dextrin in water.

In the present invention, the enzyme-decomposed dextrin and the enzyme-decomposed etherified dextrin may be used in combination. Further, other water-soluble high molecular compounds such as gum arabic may be added thereto. In general, the desensitizing gum is advantageously used in an acidic region, i.e., in a pH ranging from 3 to 6.

In order to adjust the pH valve to 3 to 6, mineral acids, organic acids or inorgainc salts are generally added to the desensitizing gum in amounts of 0.01 to 2 wt %.

Preferred organic acid include citric acid, acetic acid, oxalic acid, malonic acid, p-toluenesulfonic acid, tartaric acid, malic acid, lactic acid, levulinic acid and organic phosphonic acid. Preferred mineral acids include nitric acid, sulfuric acid and phosphoric acid.

These mineral acids, organic acids, and inorganic salts may be used alone or in combination of two or more of them.

Addition of a surfactant to the desensitizing gum of the present invention serves to improve the plane properties of the coating film. The surfactant may be an anionic surfactant or an nonionic surfactant.

The usable anionic surfactants include aliphatic alcohol sulfuric ester salts, aliphatic alcohol phosphoric esters salts, sulfonates of dibasic fatty acid esters, fatty acid amide sulfonates, alkylarylsulfonates and formaldehyde-condensed naphthalenesulfonates.

Usable nonionic surfactants include polyethylene glycol alkyl ethers, polyethylene glycol alkyl esters, sorbitan alkyl esters and polyoxypropylene polyoxyethylene ethers. These surfactants may be used in a combination of two or more. The amount of the surfactant to be used is not particularly limited but, as a preferable guide, it ranges from 0.01 to 10 wt % based on the total weight of the desensitizing gum.

In addition to the above-described ingredients, lower polyhydric alcohols such as glycerin, ethylene glycol and triethylene glycol may be used as wetting agents. These wetting agents are used in amounts ranging from 0.1 to 5.0 wt %, preferably from 0.5 to 3.0 wt %, in the resulting composition.

In addition, antiseptics may be added to the desensitizing gum of the present invention. For example, benzoic acid and its derivatives, phenol, formalin, sodium dehydroacetate, etc. may be added in amounts of 0.005 to 2.0 wt %.

The desensitizing gum of the present invention can be applied to various lithographic printing plates. It is particularly preferable to apply it to lithographic printing plates obtained by imagewise exposing and developing presensitized lithographic printing plates (which will be called "PS plate" hereinafter) comprising a support of an aluminum plate having provided thereon a light-sensitive layer. Preferable examples of negative working PS plates such as those comprising an aluminum plate having provided thereon a light-sensitive layer composed of a mixture of diazo resin (salt of a condensate between p-diazodiphenylamine and paraformaldehyde) and shellac as described in British Pat. No. 1,350,521; or those comprising an aluminum support having provided thereon a light-sensitive layer composed of a mixture of diazo resin and a polymer having hydroxyethyl methacrylate units of hydroxyethyl acrylate units as major repeating units, as described in British Pat. No. 1,460,978 and 1,505,739; and positive-working PS plates comprising an aluminum plate having provided thereon a light-sensitive layer composed of a mixture of an o-quinonediazide light-sensitive compound and a novolak type phenol resin, as described in U.S. Pat. No. 4,123,279. Further, PS plates comprising an aluminum plate having provided thereon a light-sensitive layer of photo-crosslinkable photopolymer specifically described in U.S. Pat. No. 3,860,426, PS plates comprising an aluminum plate having provided thereon a light-sensitive layer of photopolymerizable photopolymer composition as described in U.S. Pat. Nos. 4,072,528 and 4,072,527, and PS plates comprising an aluminum plate having provided thereon a light-sensitive layer composed of a mixture of an azide and a water-soluble polymer as described in British Pat. Nos. 1,235,281 and 1,495,861 are also preferable.

One embodiment of applying the desensitizing gum of the present invention to a PS plate is described below. However, the invention is not limited thereto.

A PS plate is first imagewise exposed, then developed to prepare a lithographic printing plate. This lithographic printing plate is washed with water and, fater squeezing away the water on the plate surface, a suitable amount of the desensitizing gum of the present invention is applied to the plate surface, followed by rubbing the surface with a sponge so as to spread the gum solution all over the plate surface and drying. Thus, non-image areas of the printing plate are protected, and the resulting lighographic printing plate can be stored. In order to start printing, the gum on the plate surface is washed away, and subsequent procedure are conducted in a usual manner to print copies. Alternatively, an automatic gum coater may be used to uniformly apply the gum onto the plate surface. Upon printing, sufficiently satisfactory, sharp and clear copies can be obtained immediately after initiations of printing without producing many spoiled copies, which is an important improvement over the prior art.

The present invention will now be described in more detail by reference to non-limiting examples. Additionally, percents in the following Examples are by weight unless otherwise specified.

EXAMPLE 1

250 Parts by weight of water-soluble, enzymedecomposed dextrin (trade name: Amycol 1B; made by Nichiden Chemical Corporation) was dissolved in 741.7 parts by weight of water. The resulting solution had a viscosity of 6 to 8 cps. 5 parts by weight of a 35% aqueous solution of an anionic surfactant, sodium isopropylnaphthalenesulfonate, 0.3 part by weight of sodium dehydroacetate, and 3.0 parts by weight of phosphoric acid (85%) were added to the solution to prepare a desensitizing gum of the present invention.

A 0.24-mm thick aluminum plate was dipped in a 7% aqueous solution of sodium tertiary phosphate kept at 60° C. to degrease, washed with water, and grained by rubbing with a nylon brush while applying suspension of pumice in water. After washing with water, the aluminum plate was dipped in a 5% aqueous solution of potassium silicate ($SiO_2/K_2O$ molar ratio: 2.0) kept at 70° C. for 30 to 60 seconds, washed well with water, and dried.

A light-sensitive solution composed of 2.0 parts by weight of a 2-hydroxyethyl methacrylate copolymer (prepared according to Example 1 in British Pat. No. I,505,739), 0.12 part by weight of a 2-methoxy-4-hydroxy-5-benzoylbenzenesulfonate of a condensate between p-diazodiphenylamine and paraformaldehyde, 0.03 part by weight of Oil Blue #603 (made by Orient Kagaku Kogyo Kabushiki Kaisha), 15 parts by weight of 2-methoxy-ethanol, 10 parts by weight of methanol, and 5.0 parts by weight of ethylene chloride was coated on the aforesaid aluminum support in a dry weight of 1.8 $g/m^2$ to obtain a presensitized lithographic printing plate. This printing plate was exposed using a half tone negative transparency, developed with an aqueous developing solution composed of 3.0 parts by weight of sodium sulfite, 30.0 parts by weight of benzyl alcohol, 20.0 parts by weight of triethanolamine, 5 parts by weight of monoethanolamine, 10 parts by weight of sodium t-butylnaphthalenesulfonate, and 1,000 parts by weight of pure water, washed with water, and dried.

The thus-obtained printing plate was cut into three pieces. One piece of the plate was coated with an aqueous solution of gum arabic (about 15% aqueous solution) having a specific gravity of 7°Bé and having been conventionally used as a desensitizing gum, followed by wiping off excess gum with a cloth to prepare sample A.

A second piece was coated with the above-prepared desensitizing gum of the present invention, followed by similarly wiping off excess gum with a cloth to prepare sample B.

The third piece was not coated with any desensitizing gum and used as such (sample C).

These three samples A, B, and C were placed in a thermo-hygrostat at 45° C. and 85% humidity for 3 days, then mounted on a Heidelberg KOR-D press to print in a conventional manner. With sample A, more than 100 spoiled copies had to be printed before sharp and clear copies were printed and, with samples B and C, 10 and 8 spoiled copies had to be printed, respectively.

As to stain during printing, samples A and B suffered no stains, whereas sample C was extremely easily stained. Thus, sample B using the desensitizing gum of the present invention was found to be excellent with respect to its ink-receptive properties on image areas and ink-repelling properties of non-image areas.

EXAMPLE 2

200 Parts by weight of a water-soluble etherified dextrin prepared by decomposing hydroxypropyl starch using an enzyme, 5.0 parts by weight of a 40% aqueous solution of sodium alkyldiphenyl ether disulfonate, 0.2 part by weight of ethyl p-hydroxybenzoate, 2.0 parts by weight of citric acid and 2.0 parts by weight of ammonium secondary phosphate were dissolved in 790.8 parts by weight of pure water to prepare a desensitizing gum. This desensitizing gum had a viscosity of 15 cps at 25° C.

Separately, 1 part by weight of a naphthoquinone-1,2-diazido-5-sulfonic ester of polyhydroxyphenyl obtained by polycondensation of acetone and pyrogallol described in U.S. Pat. No. 3,635,709 and 2 parts by weight of a novolak type cresolformaldehyde resin were dissolved in 40 parts by weight of methyl cellosolve to prepare a light-sensitive solution.

A 0.2-mm thick, grained aluminum plate was washed and dried, and the above-described light-sensitive solution was coated on the aluminum plate using a rotary coater to prepare a positive-working presensitized printing plate having a light-sensitive layer of a thickness of about 2.0 g/m$^2$. This plate was exposed using a half tone positive transparency, developed with a 3% sodium silicate aqueous solution, washed with water, and dried.

The resulting printing plate was cut into three pieces. One piece of the plate was coated with at 14°Bé gum arabic (about 27% aqueous solution of gum arabic) having been conventionally used as a desensitizing gum, followed by wiping off excess gum with a cloth to prepare sample A.

A second piece was coated with above-prepared desensitizing gum of the present invention, followed by similarly wiping off excess gum with a cloth to prepare sample B.

The third piece was not coated with any desensitizing gum and was used as such (sample C).

These three samples A, B, and C were placed in a thermo-hygrostat at 45° C. and 85% humidity for 7 days, then mounted on a Heidelberg KOR-D press to print in a conventional manner.

With sample A, 35 spoiled copies were printed before sharp and clear copies were printed and, with samples B and C, 5 and 3 spoiled copies had to be printed, respectively.

With respect to stain during printing, samples A and B suffered no stains, whereas sample C was extremely easily stained. Thus, sample B using the desensitizing gum of the present invention was found to be excellent with respect to its ink-receptive properties on image areas and ink-repelling properties on non-image areas.

EXAMPLE 3

A desensitizing gum composed of 200 parts by weight of water-soluble, enzyme-decomposed dextrin (trade name: Amycol 6H; made by Nichiden Chemical Corporation), 1.0 part by weight of sodium higher alcohol sulfate (trade name: Emal 40; made by Kao Atals Co., Ltd.), 2.0 parts by weight of a naphthalenesulfonic acid-formalin condensate (trade name: Demol P), 1.0 part by weight of phosphoric acid (85%), 3.0 parts by weight of magnesium sulfate, and 793.0 parts by weight of pure water was prepared. This desensitizing gum had a viscosity of 10 cps at 25° C. A presensitized printing plate obtained in the same manner as in Example 1 was imagewise exposed, developed, dried, and cut into three pieces.

One piece of the plate was coated with 14°Bé gum arabic, followed by wiping off excess gum with a cloth to prepare sample A. A second piece was coated with the above-prepared desensitizing gum of the present invention, followed by wiping off excess gum with a cloth to prepare sample B. The third piece was not coated with any desensitizing gum and used as such (sample C).

Samples A, B, and C were placed in a thermohygrostat at 45° C. and 85% humidity for 7 days, then mounted on Heidelberg GTO press conduct printing.

With sample A, more than 100 spoiled copies had to be printed before sharp and clear copies were printed and, with samples B and C, 18 and 5 spoiled copies had to be printed, respectively. Sample C was extremely easily stained. The desensitizing gum used for sample B was found to be extremely satisfactory.

EXAMPLE 4

A desensitizing gum composed of 180.0 parts by weight of water-soluble, enzyme-decomposed dextrin (trade name: Amycol 1B; made by Nichiden Chemical Corporation), 50 parts by weight of modified dextrin prepared by decomposing hydroxyethyl starch using an enzyme, 2.0 parts by weight of polyoxyethylene alkylphenyl ether (trade name: Emalgen 906; made by Kao Atlas Co., Ltd.), 5.0 parts by weight of citric acid, 3.0 parts by weight of ammonium primary phosphate, 0.3 part by weight of sodium dehydroacetate, and 759.7 parts by weight of water was prepared. This gum had a viscosity of 12 cps at 25° C. When this gum was used as a desensitizing gum for the positive-working presensitized printing plate used in Example 2, it was found that, even after placing it for 7 days at 45° C. and 85% humidity, only 7 spoiled copies had to be printed before sharp and clear copies were printed, and no stains occurred. Thus, the gum had extremely satisfactory performance as a desensitizing gum.

While the invention has been described in detail and with reference to specific embodiment thereof, it will be apparent to one skilled in the art that various changes and modifications can be made therein without departing from the spirit and scope thereof.

What is claimed is:

1. A gumming process for a lithographic printing plate, comprising applying a desensitizing gum to an exposed and developed presensitized lithographic printing plate, spreading the desensitizing gum all over the plate surface, wiping off excess desensitizing gum and drying, the desensitizing gum comprising water having dissolved therein 5 to 35 wt %, based on the total weight of the desensitizing gum, of at least one of a film-forming, water-soluble compound selected from the group consisting of (A) enzyme-decomposed dextrin prepared by decomposing a starch selected from the group consisting of potato starch, sweet potato starch, wheat starch, corn starch, tapioca starch and rice starch using an enzyme selected from the group consisting of α-amylase, β amylase and saccharogenic amylase and (B) enzyme-decomposed etherified dextrin prepared by decomposing hydroxyethyl starch, hydroxypropyl starch and ethyl starch using an enzyme selected from the group consisting of α-amylase, β-amylase and saccharogenic amylase; wherein said enzyme-decomposed dextrin or said enzyme-decomposed etherified dextrin is prepared by decomposition to the degree that said enzyme-decomposed dextrin or said enzyme-decomposed etherified dextrin contains 10 to 40 wt % of reducing sugar.

2. A gumming process as claimed in claim 1, wherein the film-forming, water-soluble compound is present in an amount in the range of 10 to 25 wt. %.

3. A gumming process as claimed in claim 1, wherein the desensitizing gum has a pH in the range of 3 to 6.

4. A gumming process as claimed in claim 1, wherein the desensitizing gum further comprises a pH adjusting agent selected from the group consisting of mineral acids, organic acids and inorganic acids, the pH adjusting agent present in an amount in the range of 0.01 to 2 wt. % based on the total weight of the desensitizing gum.

5. A gumming process as claimed in claim 1, wherein the desensitizing gum further comprises a surfactant.

6. A gumming process as claimed in claim 5, wherein the surfactant is present in an amount in the range of 0.01 to 10 wt. % based on the total weight of the desensitizing gum.

7. A gumming process as claimed in claim 1, wherein said desensitizing gum further comprises a wetting agent present in an amount in the range of 0.1 to 5.0 wt. % based on the total weight of the desensitizing gum.

8. A gumming process as claimed in claim 7, wherein the wetting agent is present in an amount in the range of 0.5 to 3.0 wt. % based on the total weight of the desensitizing gum.

9. A gumming process as claimed in claim 1, wherein the desensitizing gum further comprises an antiseptic present in an amount in the range of 0.005 to 2.0 wt. % based on the total weight of the desensitizing gum.

* * * * *